United States Patent [19]
Schwindt

[11] Patent Number: 5,610,529
[45] Date of Patent: Mar. 11, 1997

[54] PROBE STATION HAVING CONDUCTIVE COATING ADDED TO THERMAL CHUCK INSULATOR

[75] Inventor: Randy Schwindt, Portland, Oreg.

[73] Assignee: Cascade Microtech, Inc., Beaverton, Oreg.

[21] Appl. No.: 431,104

[22] Filed: Apr. 28, 1995

[51] Int. Cl.⁶ .................................................. G01R 31/02
[52] U.S. Cl. .................................... 324/760; 324/754
[58] Field of Search .................................. 324/760, 754, 324/765; 219/209

[56] References Cited

U.S. PATENT DOCUMENTS

| | | | |
|---|---|---|---|
| 3,289,046 | 11/1966 | Carr | 324/760 |
| 3,710,251 | 1/1973 | Hagge et al. | 324/760 |
| 4,115,736 | 9/1978 | Tracy | 324/760 |
| 4,426,619 | 1/1984 | Demand | 324/760 |
| 4,491,173 | 1/1985 | Demand | 165/11.1 |
| 4,503,335 | 3/1985 | Takahashi | 324/765 |
| 4,691,831 | 9/1987 | Suzuki et al. | 324/537 |
| 4,734,872 | 3/1988 | Eager et al. | 364/557 |
| 4,757,255 | 7/1988 | Margozzi | 324/760 |
| 4,759,712 | 7/1988 | Demand | 433/32 |
| 4,777,434 | 10/1988 | Miller et al. | 219/209 |
| 4,784,213 | 11/1988 | Eager et al. | 165/2 |
| 4,845,426 | 7/1989 | Nolan et al. | 324/760 |
| 4,856,904 | 8/1989 | Akagawa | 324/158.1 |
| 4,968,931 | 11/1990 | Littlebury et al. | 324/760 |
| 4,978,914 | 12/1990 | Akimoto et al. | 219/209 |
| 5,001,423 | 3/1991 | Abrami et al. | 324/760 |
| 5,006,796 | 4/1991 | Burton et al. | 324/760 |
| 5,077,523 | 12/1991 | Blanz | 324/760 |
| 5,084,671 | 1/1992 | Miyata et al. | 324/760 |
| 5,164,661 | 11/1992 | Jones | 324/760 |
| 5,210,485 | 5/1993 | Kreiger et al. | 324/758 |
| 5,220,277 | 6/1993 | Reitinger | 324/754 |
| 5,266,889 | 11/1993 | Harwood et al. | 324/760 |
| 5,325,052 | 6/1994 | Yamashita | 324/760 |
| 5,345,170 | 9/1994 | Schwindt et al. | 324/754 |
| 5,461,328 | 10/1995 | Deveraux et al. | 324/765 |

OTHER PUBLICATIONS

Low Level Measurements For Effective Low Current, Low Voltage, and High Impedance Measurements by Keithley Instruments, Inc., Jun. 1984, pp. 12, and 24.

Appliciton Note 1 Controlled Environment Enclosure for Low Temperature Wafer Probing in a Moisture–Free Environment, Temptronic Corporation, at least one year prior to filing date, (Mar. 1995) 2 pages.

Test Station Acessories (7000–LTE Light Tight Enclosure, Dry Box for Low Temperature Probing), Micromanipulator Sales and Service, Inc.,at least one year prior to filing date, (Mar. 1995), 1 page.

Model TP03000 Series ThermoChuck Systems for Probing, Characterization and Failure Analysis of Wafers, Chips and Hybrids at High and Low Temperatures, Temptronic Corporation, at least one year prior to filing date, (Mar. 1995), pp. 2–5.

Yousuke Yamamoto, A Compact Self–Shielding Prober for Accurate Measurement of On–Wafer Electron Devices, IEEE Transactions on Instrumentation and Measurement, vol. 38, No. 6, Dec. 1989, pp. 1088–1093.

K. Cole, Temptronics "Guarded" Chuck, Nov. 15, 1989, 1 page.

Ken Cole, facsimile from Ken Cole, Mar. 10, 1995, 2 pages.

*Primary Examiner*—Ernest F. Karlsen
*Attorney, Agent, or Firm*—Chernoff, Vilhauer, McClung & Stenzel

[57] ABSTRACT

A probe station suitable for low noise measurements includes a chuck for supporting a test device and a supporting surface for the test device. The probe station has means for controlling the temperature in the vicinity of the test device by sensing the temperature and, in response to the sensing, alternatively raising or lowering the temperature. At least two layers including a first electrically conductive layer adhered to an insulator layer are disposed between the supporting surface and the chuck. The electrically conductive layer is electrically connected to one of the chuck and supporting surface.

18 Claims, 1 Drawing Sheet

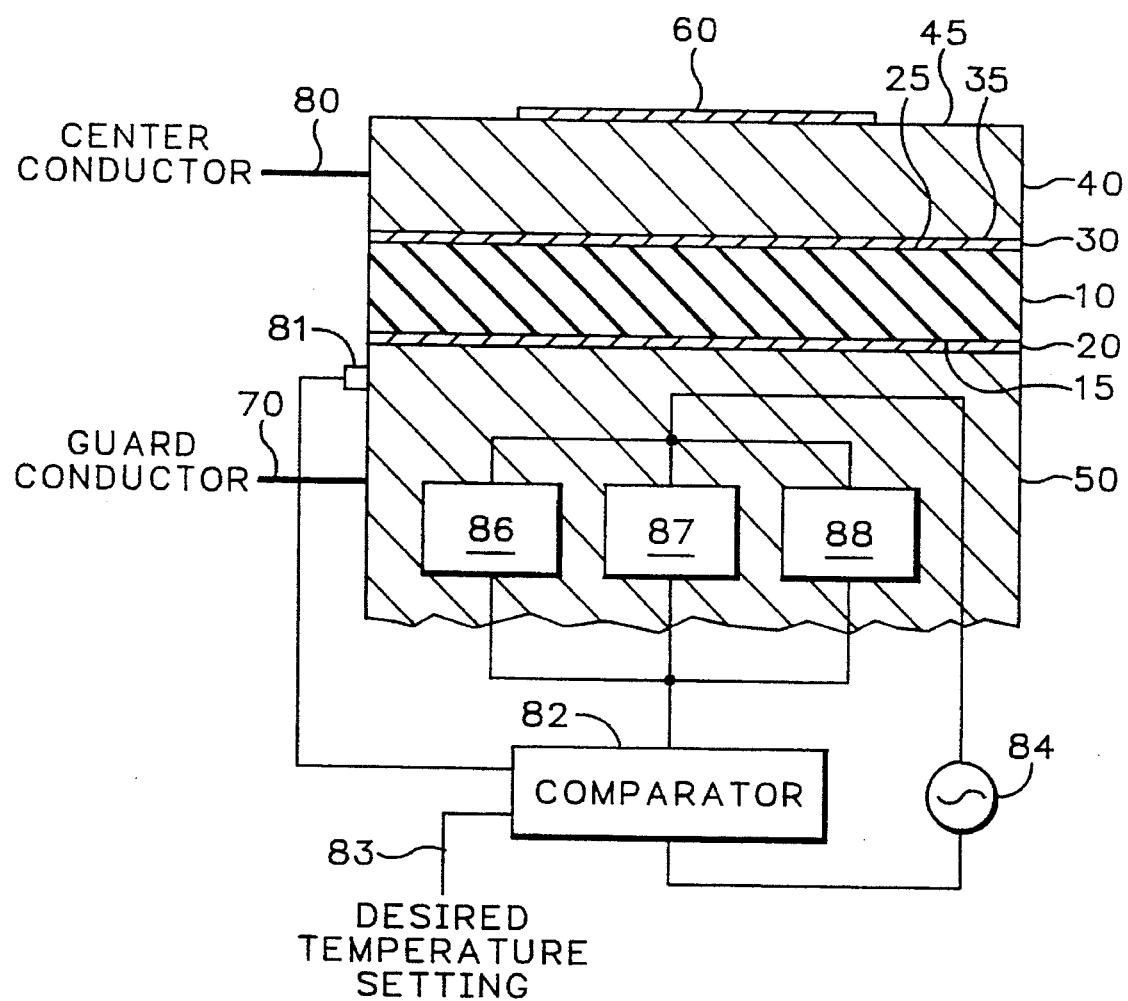

PROBE STATION HAVING CONDUCTIVE COATING ADDED TO THERMAL CHUCK INSULATOR

BACKGROUND OF THE INVENTION

The present invention is directed to probe stations particularly suitable for making highly accurate low-current and low-voltage measurements of electronic devices, and especially electronic devices fabricated on a wafer. More particularly, the present invention relates to additional layers used in conjunction with a temperature-controlled chuck within such a probe station.

Integrated circuit devices are typically manufactured in and on a single wafer of semiconductor material using well-known techniques. Prior to cutting the individual integrated circuit devices from the single wafer for encapsulation, typically predetermined test sequences are run on each integrated circuit device on the wafer to determine if each device operates properly. A probe card, which includes a plurality of electrodes configured to conform to the particular geometry of the integrated circuit devices fabricated on the wafer, may be used in conjunction with a probe station to test the circuitry. The wafer and probe card are moved relative to each other until all the integrated circuit devices on the wafer have been tested. Schwindt et al., U.S. Pat. No. 5,345,170, Harwood, et al., U.S. Pat. No. 5,266,889 and Schwindt, et al., U.S. patent application Ser. No. 08/100,494 filed Aug. 2, 1993, disclose examples of probe stations with which this invention may be used, and are incorporated herein by reference. Alternatively, individually positionable probes may be used for testing wafers and other types of test devices in conjunction with a probe station.

Many integrated circuit devices are designed to operate at temperatures other than ambient room temperature. To accommodate device testing at nonambient temperatures, temperature-controlled chucks, generally referred to as thermal chucks, may be employed. One design of a thermal chuck includes a base with internal cavities for circulating cold fluids to lower the temperature of the thermal chuck below ambient temperature. Affixed to the upper surface of the base are multiple heating-cooling elements and a conductive top surface. The heating-cooling elements, typically constructed of peltier devices, regulate the temperature of the top surface by varying the current level and polarity of the current. If the desired temperature is above a predetermined temperature, such as the ambient temperature, then the heating-cooling elements regulate the temperature. If the desired temperature is lower than the predetermined temperature, such as the ambient temperature, then the heating-cooling elements, in combination with the fluid flow in the base if significant cooling is desired, regulate the temperature. The thermal chuck may include a temperature sensor located on or in the vicinity of the thermal chuck to sense the temperature. In response to sensing the temperature, the level and polarity of the current provided to the heating-cooling elements is automatically varied to maintain a near constant temperature. For example, when the temperature of the thermal chuck is too low, the current level supplied to the heating-cooling elements is increased to raise the temperature. Contrary, if the temperature of the thermal chuck is too high, the current level supplied to the heating-cooling elements is decreased and the polarity reversed to lower the temperature.

The wafer, with its integrated circuit devices, is secured to the top surface of the thermal chuck to perform tests on the circuit devices at different temperatures. However, for low-voltage and low-current measurements an unacceptably high level of noise is observed in measurements when using the thermal chuck. The temperature control system inherently fluctuates the current level provided to the heating-cooling elements in order to maintain the desired temperature. The fluctuations in the current level and polarity supplied to the heating-cooling elements, which are typically small and very rapid in nature, result in fluctuations in the electromagnetic fields produced by the heating-cooling elements and their associated electrical wiring. The traditional wisdom has been that the changing electromagnetic fields produced by the changing currents within the heating-cooling elements and their associated electrical wiring are somehow electromagnetically coupled into the surface upon which the wafer is placed. This conclusion is further supported by the noise observed while making measurements, which appears to have the same relative magnitudes and timing as the fluctuations in the current level supplied to the heating-cooling elements. Accordingly, the traditional wisdom is that the changing electromagnetic fields are the primary source of the noise observed between the wafer and the thermal chuck when taking measurements. It is highly desirable to minimize the noise to facilitate more accurate measurements.

One way to reduce the noise produced by the electromagnetic fields has been to shield the wafer from the electromagnetic fields by adding additional layers to the conductive top surface of the thermal chuck. The additional layers have included a stacked structure of three layers, including a pair of insulation layers each of which is positioned on either side of an interposed copper layer. A conductive supporting layer for supporting the device under test is positioned on top of the aforementioned three layers. All four layers are secured to the thermal chuck by teflon screws but are not adhered to each other. The copper layer is connected to the guard conductor of a triaxial cable, the thermal chuck is connected to the shield, and the supporting layer is connected to the center conductor. The additional layers, and particularly the grounded thermal chuck, act to shield the test device from the electromagnetic fields. A reduction in the noise has been observed; however, significant noise levels still remain.

A different design to attempt to provide superior shielding of the test device has involved replacing the stacked structure of three layers with a copper foil layer encapsulated in polyamide. The foil is connected to the guard conductor and the supporting layer is connected to the center conductor. A further reduction in the noise level with respect to the aforementioned structure has been observed; however, significant noise levels still remain.

A still further design has involved replacing the three stacked layers with a ceramic layer. The thermal chuck is connected to the guard conductor and the supporting layer is connected to the center conductor. The absence of an interposed conductive layer, however, seems to decrease the shielding from the electromagnetic fields resulting in high noise levels.

Yet another alternative design has involved replacing the three stacked layers with a copper foil layer interdisposed between an insulator layer and a ceramic layer. The three stacked layers are not adhered to one another. The foil is connected to the guard conductor, the thermal chuck is connected to the shield, and the supporting layer is connected to the center conductor. During tests this design appears to be an improvement over all the aforementioned designs for shielding the test device from the electromagnetic fields. However, the noise observed is still unacceptably high for low-current and low-voltage measurements.

What is desired therefore is an additional layer structure for use with a temperature-controlled chuck to significantly reduce the noise observed during low-current and low-voltage measurements.

SUMMARY OF THE PRESENT INVENTION

The present invention overcomes the aforementioned drawbacks of the prior art by providing a probe station suitable for low noise measurements that includes a chuck for supporting a test device and a supporting surface for the test device. The probe station has means for controlling the temperature in the vicinity of the test device by sensing the temperature and, in response to the sensing, alternatively raising or lowering the temperature. At least two layers including a first electrically conductive layer adhered to an insulator layer are located between the supporting surface and the chuck. The electrically conductive layer is electrically connected to one of the chuck and supporting surface.

In contrast to the traditional wisdom that the electromagnetic fields produced by the heating-cooling elements and their associated electrical wiring are the cause of the measured noise levels, the present inventors have discovered that a major cause of the noise is a far more subtle effect, namely, thermal expansion and contraction between adjacent conducting and insulating layers resulting in friction between the adjacent layers. The friction results in charge buildups, known as triboelectric currents, which have been identified by the present inventors as a significant cause of noise in low-voltage and low-current measurements under controlled-temperature conditions. By adhering the electrically conductive layer to the insulator layer and electrically connecting the conductive layer to either the chuck or the supporting surface, the expansion and contraction of either the chuck or supporting surface will not result in triboelectric currents between the insulator layer and the conductive layer.

In a preferred embodiment of the present invention the at least two layers constitute a sandwich structure of at least three layers including a first electrically conductive layer adhered to one side of an insulator layer and a second electrically conductive layer adhered to the other side of the insulator layer. The sandwich structure of three layers is located between the supporting surface and the chuck.

Preferably, the first and second conductive layers are electrically connected to the chuck and supporting surface, respectively. Accordingly, the expansion and contraction of either the chuck or the supporting surface will not result in the creation of triboelectric currents on either side of the insulator layer.

The foregoing and other objectives, features, and advantages of the invention will be more readily understood upon consideration of the following detailed description of the invention, taken in conjunction with the accompanying drawings.

BRIEF DESCRIPTION OF THE DRAWINGS

The single figure is a sectional, partially schematic view of an exemplary embodiment of the present invention showing additional layers for use with a probe station that includes a temperature-controlled chuck.

DETAILED DESCRIPTION OF THE PREFERRED EMBODIMENT

Directly contrary to the traditional wisdom and teachings that all noise caused by a temperature-controlled chuck is a result of electromagnetic field variations from the heating-cooling elements and their associated electrical wiring, which is in turn a result of current level fluctuations in the feedback loop of the heating-cooling elements, the present inventors have discovered that mere shielding will not sufficiently reduce the noise for low-noise and low-current measurements. The present inventors have discovered that the noise is not merely a result of the apparent electromagnetic field fluctuations resulting from the heating-cooling elements and their associated electrical wiring, but is also the result of a far more subtle effect, namely, the thermal properties of the temperature-controlled chuck and additional layers placed thereon. Accordingly, attempting to further refine the effectiveness of the shielding provided by the additional layers will not significantly further reduce the noise and is a misdirected effort. The thermal properties of conductive material, such as the conductive chuck surface, expand and contract as the temperature of the chuck is increased and decreased, respectively. The increase and decrease in the temperature of the chuck is a result of the heating-cooling elements attempting to maintain the temperature.

The expansion and contraction is believed to be directed both in the horizontal plane of the chuck surface, thereby increasing and decreasing the surface area, and also in the vertical axis of the chuck, thereby increasing and decreasing the thickness of the chuck. Further, the heating-cooling elements are discrete elements and accordingly are not evenly distributed within the thermal chuck. The uneven distribution of the heating-cooling elements may result in the thermal expansion and contraction of the chuck surface area and thickness in a nonuniform manner resulting in twisting and bowing of the chuck. The twisting and bowing results in a variable capacitance between the thermal chuck and the test device. The collective result of the thermal effects is first that the expansion and contraction of the chuck will result in relative movement and friction with respect to any additional layers placed thereon, and second that the twisting and bowing may cause the capacitance to be nonuniform.

Triboelectric currents are generated by charges created between a conductor and an insulator due to friction. The free electrons rub off the conductor and create a charge imbalance that causes the current flow. A typical example would be electrical currents generated by insulators and conductors rubbing together in a coaxial cable. "Low-noise" cable greatly reduces this effect by typically using an inner insulator of polyethylene coated with graphic underneath the outer shield. The graphite provides lubrication and a conducting equipotential cylinder to equalize charges and minimize charge generated by frictional effects of cable movement. Triboelectric currents are traditionally considered in relation to the physical bending of materials, such as co-axial cables. The time over which the physical bending of the co-axial cables occurs is relatively long, e.g. low frequency. The present inventors have discovered that the same phenomena, namely, triboelectric currents, is a major cause of noise in measurements when using temperature-controlled chucks as a result of temperature induced movements occurring at high frequencies.

The previous designs for additional layers added to the chuck surface did not take into account the thermal effects, and in particular the triboelectric currents. Accordingly, the additional layers were designed with a conducting chuck surface interfaced with an insulator as the next adjacent layer. The friction created by thermal expansion and contraction between the conducting chuck surface and the insulator results in triboelectric currents. The triboelectric currents are capacitively coupled through any intervening layers to the supporting layer and manifest themselves as noise in measurements in the test device. Furthermore, in some prior designs an insulating layer was sandwiched between conducting layers that were not adhered to each other. The temperature changes of the interdisposed conducting layer results in expansion and contraction with respect to the adjacent insulating layers, and also creates triboelectric currents. Additionally, an insulating layer which expands and contracts with respect to an adjacent conducting supporting layer will also create triboelectric currents. In other words, all the expansion and contraction, e.g. friction, at insulator-conductor interfaces as a result of the additional layers will create triboelectric currents, thereby increasing the noise observed in the measurements. The triboelectric currents as a result of the friction between insulator-conductor interfaces needs to be reduced or otherwise eliminated.

To significantly reduce the triboelectric currents created when using a temperature-controlled chuck, which typically includes a conductive top surface, a different set of additional layers is used in accordance with the preferred embodiment shown in the single figure. An electrical insulator 10 is coated on one surface 15 with an electrically conductive material 20. The preferred electrical insulator is a 0.17 inch thick Boron Nitride, although other insulators may also be used, such as sapphire. The electrically conductive material or layer 20 is preferably 500–800 Angstroms of Titanium-Tungsten (10% Titanium and 90% Tungsten) with a further coating of 1000–1500 Angstroms of Gold on the Titanium-Tungsten for added durability. Both conductive materials are preferably deposited over the entire surface 15 of the insulator 10 using any suitable deposition method, and thereby adhered to the surface. Alternatively, the conductive material 20 may be a sheet of conductive material adhered at least throughout a major portion of its area to the insulator 10 in any suitable manner. The effect of adhering the conductive material 20 to the insulator 10 is to eliminate any movement between the conductive material 20 and the insulator 10 which eliminates the creation of triboelectric currents between their surfaces. The interface between the conductive material 20 and the conductive thermal chuck 50 is conductive and therefore instantaneously dissipates any buildup of charges created due to thermal expansion and movement of the thermal chuck 50 relative to the conductive material 20, eliminating the need for any adhesions between these two elements.

The conductive material 20 may alternatively be a powdered conductive material, such as graphite. While securing the additional layers to the thermal chuck 50 the graphite will impregnate the insulator 10 to some degree and become at least partially adhered to the surface 15 of the insulator 20 sufficiently to reduce or eliminate triboelectric currents at that interface.

Another electrically conductive material or layer 30 is preferably adhered to the other surface 25 of the insulator 10. The conductive material 30 is preferably the same as conductive material 20. The electrically conductive material 30 further prevents the buildup of charges between the insulator 10 and a conductive supporting layer 40 having a supporting surface 45 for supporting a test device 60, such as a wafer or other device. The supporting layer is preferably 0.25 inch thick nickel or gold plated aluminum. Alternatively, the supporting surface 45 could be the upper surface 35 of the conductive material 30, in which case the layer 40 would be eliminated; or, as a further alternative, the supporting layer 40 could be adhered directly to the insulator layer 10, in which case the layer 30 would be eliminated. Also, the layer 20 could be eliminated with the chuck 50 adhered directly to the insulator layer 10.

All additional layers 10, 20, 30 and 40 are preferably secured in place with a conventional vacuum system, but alternatively screws or some other securement method may be used. The guard conductor 70 is connected to the thermal chuck 50, and the center conductor 80 is connected to the supporting layer 40. Preferably, both the insulator 10 and conductive materials 20 and 30 have peripheral edges that terminate into free space and are coextensive with each other, forming an adhered sandwich structure conveniently insertable between the elements 40 and 50 of an existing chuck assembly.

The temperature control system used in conjunction with the features described above can be any of numerous different types. For example, to control the temperature in the vicinity of the test device 60 above or below ambient temperature, an electrical system such as that shown in the figure can sense such temperature with a sensor 81 and continuously feed a temperature signal to a comparator 82 which compares the sensed temperature signal with an input from line 83 representative of the user's desired adjustable temperature setting. The comparator can then regulate the current from a power source 84 to electrical heating-cooling elements 86, 87, 88, increasing the current when the sensed temperature falls below the desired setting and decreasing the current and changing its polarity when the sensed temperature rises above the desired setting. Such electrical system can be used either with or without an associated fluid cooling system in the chuck 50, depending upon the temperature levels desired. Alternatively, a temperature control system may also be provided without electrical heating-cooling elements by controlling the temperature of a gas or liquid flowing through the thermal chuck 50 in response to the temperature sensed by the sensor 81. Another alternative is to provide temperature control independently of the chuck 50 by controlling the temperature of a gas forced into the vicinity of the test device in response to the temperature sensed by the sensor 81. Examples of this latter type of system are shown in Demand U.S. Pat. No. 4,426,619 and Eager et al. U.S. Pat. No. 4,734,872, which are incorporated herein by reference.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

What is claimed is:

1. A probe station suitable to reduce the level of noise in measurements comprising:

(a) a support for supporting a test device;

(b) means for controlling the temperature in the vicinity of said test device by sensing said temperature and, in response to said sensing, alternatively raising or lowering said temperature;

(c) a supporting surface for said test device, said supporting surface being mounted upon said support;

(d) at least two layers including an electrically conductive layer adhered to an electrical insulator layer; and (e) said electrically conductive layer being electrically connected to one of said support and supporting surface and said at least two layers being located between said supporting surface and said support.

2. The probe station of claim 1 wherein said supporting surface is a surface of said electrically conductive layer.

3. The probe station of claim 1 wherein said support is electrically conductive.

4. The probe station of claim 1 wherein said supporting surface is electrically conductive.

5. The probe station of claim 1 wherein said at least two layers have respective mutually facing areas, said layers being adhered to each other throughout at least a major portion of said respective mutually facing areas.

6. The probe station of claim 1 including a further electrically conductive layer adhered to said insulator layer and being electrically connected to the other of said support and supporting surface.

7. The probe station of claim 1 wherein said insulator layer has a peripheral edge and said electrically conductive layer has a peripheral edge, said peripheral edges terminating into free space.

8. The probe station of claim 7 wherein said peripheral edges are substantially coextensive with each other.

9. A probe station suitable to reduce the level of noise in measurements comprising:
   (a) a support for supporting a test device;
   (b) means for controlling the temperature in the vicinity of said test device by sensing said temperature and, in response to said sensing, alternatively raising or lowering said temperature;
   (c) a supporting surface for said test device, said supporting surface being mounted upon said support;
   (d) a sandwich structure of at least three layers including a first electrically conductive layer adhered to one side of an electrical insulator layer and a second electrically conductive layer adhered to an opposite side of said insulator layer; and
   (e) said sandwich structure of said at least three layers being located between said supporting surface and said support.

10. The probe station of claim 9 wherein said supporting surface is a surface of one of said first electrically conductive layer and said second electrically conductive layer.

11. The probe station of claim 9 wherein said support is electrically conductive.

12. The probe station of claim 9 wherein said supporting surface is electrically conductive.

13. The probe station of claim 9 wherein said at least three layers have respective mutually facing areas, said first and second electrically conductive layers being adhered to said insulator layer throughout at least a major portion of said respective mutually facing areas.

14. The probe station of claim 9 wherein said insulator layer has a peripheral edge and said first and second electrically conductive layers each have a respective peripheral edge, said peripheral edges all terminating into free space.

15. The probe station of claim 14 wherein said peripheral edges are substantially coextensive which each other.

16. The probe station of claim 9 wherein said first electrically conductive layer is electrically connected to said support.

17. The probe station of claim 9 wherein said first electrically conductive layer is electrically connected to said supporting surface.

18. The probe station of claim 17 wherein said second electrically conductive layer is electrically connected to said support.

* * * * *